United States Patent
Pinto et al.

(10) Patent No.: US 7,943,451 B2
(45) Date of Patent: May 17, 2011

(54) INTEGRATION SCHEME FOR REDUCING BORDER REGION MORPHOLOGY IN HYBRID ORIENTATION TECHNOLOGY (HOT) USING DIRECT SILICON BONDED (DSB) SUBSTRATES

(75) Inventors: Angelo Pinto, San Diego, CA (US); Frank S. Johnson, Wappingers Falls, NY (US)

(73) Assignee: Texas Instruments Incorporated, Dallas, TX (US)

( * ) Notice: Subject to any disclaimer, the term of this patent is extended or adjusted under 35 U.S.C. 154(b) by 288 days.

(21) Appl. No.: 12/343,743

(22) Filed: Dec. 24, 2008

(65) Prior Publication Data
US 2009/0159932 A1 Jun. 25, 2009

Related U.S. Application Data

(60) Provisional application No. 61/016,545, filed on Dec. 24, 2007.

(51) Int. Cl.
*H01L 21/336* (2006.01)
(52) U.S. Cl. .......... 438/198; 257/E21.119; 257/E21.133
(58) Field of Classification Search .................. 438/198, 438/199; 257/E21.119, E21.12, E21.133
See application file for complete search history.

(56) References Cited

U.S. PATENT DOCUMENTS
7,608,522 B2 * 10/2009 Lin et al. ........................ 438/455
2008/0188046 A1 * 8/2008 Hierlemann et al. ......... 438/221
* cited by examiner

*Primary Examiner* — Ben P Sandvik
*Assistant Examiner* — W. Wendy Kuo
(74) *Attorney, Agent, or Firm* — Jacqueline J. Garner; Wade J. Brady, III; Frederick J. Telecky, Jr.

(57) ABSTRACT

Optimizing carrier mobilities in MOS transistors in CMOS ICs requires forming (100)-oriented silicon regions for NMOS and (110) regions for PMOS. Boundary regions between (100) and (110) regions must be sufficiently narrow to support high gate densities and SRAM cells appropriate for the technology node. This invention provides a method of forming an integrated circuit (IC) substrate containing regions with two different silicon crystal lattice orientations. Starting with a (110) direct silicon bonded (DSB) layer on a (100) substrate, regions in the DSB layer are amorphized and recrystallized on a (100) orientation by solid phase epitaxy (SPE). Lateral templating by the DSB layer is reduced by amorphization of the upper portion of the (110) regions through a partially absorbing amorphization hard mask. Boundary morphology is less than 40 nanometers wide. An integrated circuit formed with the inventive method is also disclosed.

15 Claims, 5 Drawing Sheets

INTEGRATION SCHEME FOR REDUCING BORDER REGION MORPHOLOGY IN HYBRID ORIENTATION TECHNOLOGY (HOT) USING DIRECT SILICON BONDED (DSB) SUBSTRATES

FIELD OF THE INVENTION

This invention relates to the field of integrated circuits. More particularly, this invention relates to methods of fabricating integrated circuits containing regions with different crystal orientations.

BACKGROUND OF THE INVENTION

It is well recognized that increasing the mobility of charge carriers in metal oxide semiconductor (MOS) transistors in integrated circuits (ICs) improves the operating speed of ICs. There are several techniques used in advanced ICs to increase the mobilities of electrons and holes in silicon n-channel MOS (NMOS) and p-channel (PMOS) transistors, including orienting the silicon substrate to take advantage of the fact that carrier mobility varies depending on the orientation of the crystal lattice in the MOS transistor channel. Electrons have maximum mobility in (100)-oriented silicon when the NMOS transistor is aligned on a [110] axis, that is, when the electron movement in the NMOS transistor channel is along a [110] direction. Holes have maximum mobility in (110)-oriented silicon when the PMOS transistor is aligned on a [110] axis. To maximize the mobilities of electrons and holes in the same IC requires regions with (100)-oriented silicon and (110)-oriented silicon in the substrate, known as hybrid orientation technology (HOT). Known methods of HOT include amorphization and templated recrystallization (ATR). In one variation of ATR, in which recrystallization is performed before a shallow trench isolation (STI) process, discontinuities and defects (morphology) are introduced in a region approximately 100 nanometers wide at the lateral boundaries between (100)-oriented and (110)-oriented silicon. The morphology region is not suitable for MOS transistors, proscribing conventional ATR for use in circuits requiring high transistor density, such as SRAMs or logic gates. The morphology region also imposes unacceptable limits on transistor scaling. In another variation of ATR, in which recrystallization is performed after an STI process, stable defects are introduced at the STI boundaries which require anneals over 1250 C to be eliminated. Such anneals are incompatible with maintaining dimensional integrity of the substrate required for deep submicron lithography used in the 65 nanometer technology node and more advanced nodes.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

This invention provides a method of forming an integrated circuit (IC) which has two types of regions with different silicon crystal lattice orientations, (100)-oriented silicon and (110)-oriented silicon, for forming transistors, in order to optimize performance parameters, such as carrier mobility, for NMOS and PMOS transistors separately. The method starts with a single crystal substrate of (100)-oriented silicon with a directly bonded silicon (DSB) layer of (110)-oriented silicon formed on the top surface of the substrate. A partially absorbing amorphization hard mask layer is formed over regions for PMOS transistors, followed by an amorphizing ion implant which completely amorphizes the (110)-oriented silicon layer in NMOS regions and amorphizes the silicon in the top portion of the DSB layer under the partially absorbing amorphization hard mask layer. A solid phase epitaxial (SPE) process is performed in which (100)-oriented silicon is formed in the NMOS regions using the (100)-oriented silicon in the wafer substrate for a seed layer. Lateral spread of the boundary region between the DSB layer and the SPE layer is reduced by the presence of the amorphized silicon in the PMOS regions, which recrystallizes to form (110)-oriented silicon using the DSB silicon for a seed layer, and does not template (110)-oriented recrystallization into the NMOS regions. An integrated circuit formed using the inventive method is also disclosed.

DETAILED DESCRIPTION

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

To assist readability of this disclosure, silicon crystal orientations will be referred to using the nomenclature "(100)-oriented silicon" or "(110)-oriented silicon" to avoid confusion with numerical designations of elements in the figures attached to this disclosure, for example "the field oxide (100)."

The instant invention addresses the need for a robust and cost effective method of fabricating integrated circuits (ICs) with regions of different crystal lattice orientation, known as hybrid orientation technology (HOT), by providing a direct silicon bonded (DSB) substrate in which a layer of (110)-oriented silicon is attached to a (100)-oriented silicon wafer substrate, forming a partially absorbing amorphization hard mask layer over regions for PMOS transistors, performing an amorphizing ion implant which completely amorphizes the (110)-oriented silicon layer in NMOS regions and partially amorphizes the silicon at the surface in the PMOS regions, and recrystallizing the amorphous silicon in a solid phase epitaxial (SPE) process in which (100)-oriented silicon is formed in the NMOS regions using the (100)-oriented silicon in the wafer substrate for a seed layer. Lateral spread of the morphology region is reduced by the presence of the partially amorphized silicon in the PMOS regions, which recrystallizes to form (110)-oriented silicon using the DSB silicon for a seed layer, and does not template (110)-oriented recrystallization into the NMOS regions.

FIG. 1A through FIG. 1F are cross-sections of an integrated circuit during fabrication of NMOS and PMOS transistors according to an embodiment of the instant invention.

Figure 1A:
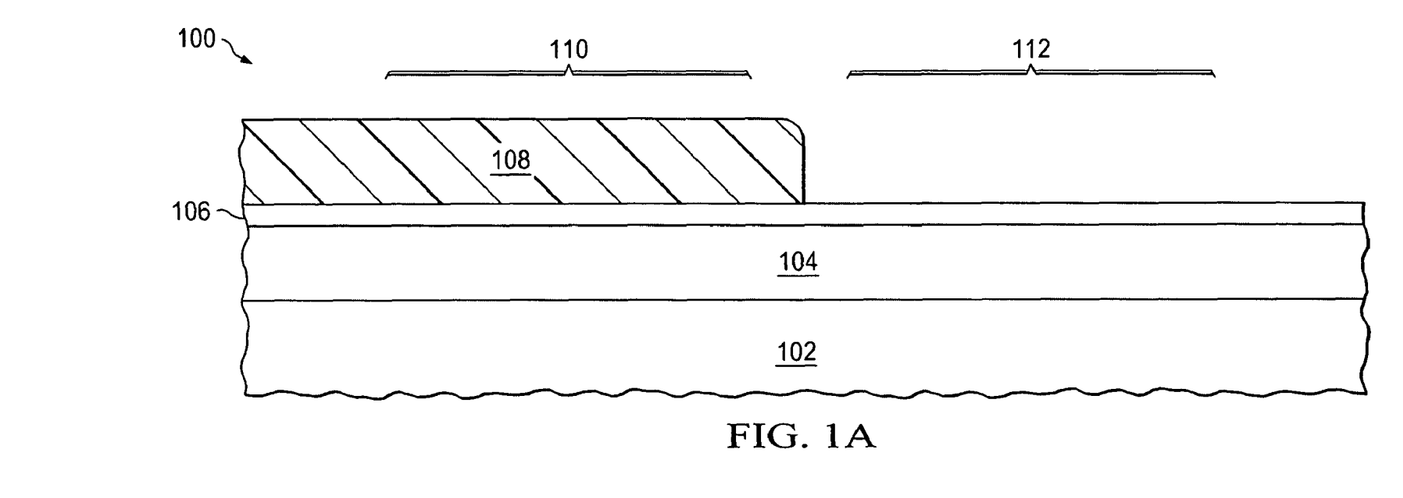
FIG. 1A through FIG. 1F are cross-sections of an integrated circuit during fabrication of NMOS and PMOS transistors according to an embodiment of the instant invention.

FIG. 1A is a cross-section of a hybrid substrate (100), which includes a substrate (102) of (100)-oriented silicon, typically p-type with a resistivity of 1 to 100 ohm-cm, and a DSB layer (104) of (110)-oriented silicon, typically p-type with an electrical resistivity of 1 to 100 ohm-cm, on a top surface of the substrate (102). The DSB layer (104) is 100 to 250 nanometers thick. In one embodiment, the DSB layer (104) is substantially undoped. In a further embodiment, germanium or carbon atoms may be added to change a material property, such as increase stress in the DSB layer (104) which can be advantageous by increasing transistor on-state drive current. A partially absorbing amorphization hard mask layer (106), of silicon dioxide, silicon nitride, silicon oxy-nitride, or a combination of these materials, approximately one-third as thick as the DSB layer (104), is formed on a top surface of the DSB layer (104). A photoresist pattern (108) is formed on a top surface of the amorphization hard mask layer (106), covering a p-channel MOS transistor (PMOS) region (110) and exposing an n-channel MOS transistor (NMOS) region (112).

Figure 1B:
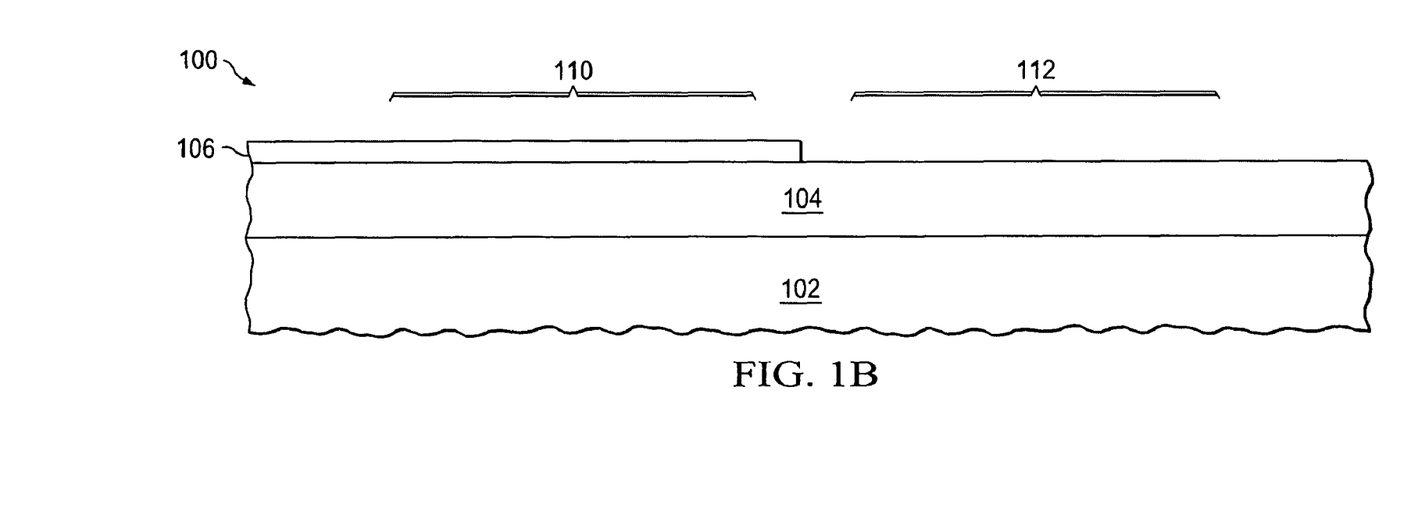

FIG. 1B depicts the IC (100) after removal of the amorphization hard mask layer (106) in the NMOS region (112) by known etching techniques, commonly plasma etching using fluorine containing gases. After etching the amorphization hard mask layer (106), the photoresist and etch residue are removed, typically by ashing in an oxygen-containing plasma followed by immersion in a mixture of sulfuric acid and peroxide.

Figure 1C:
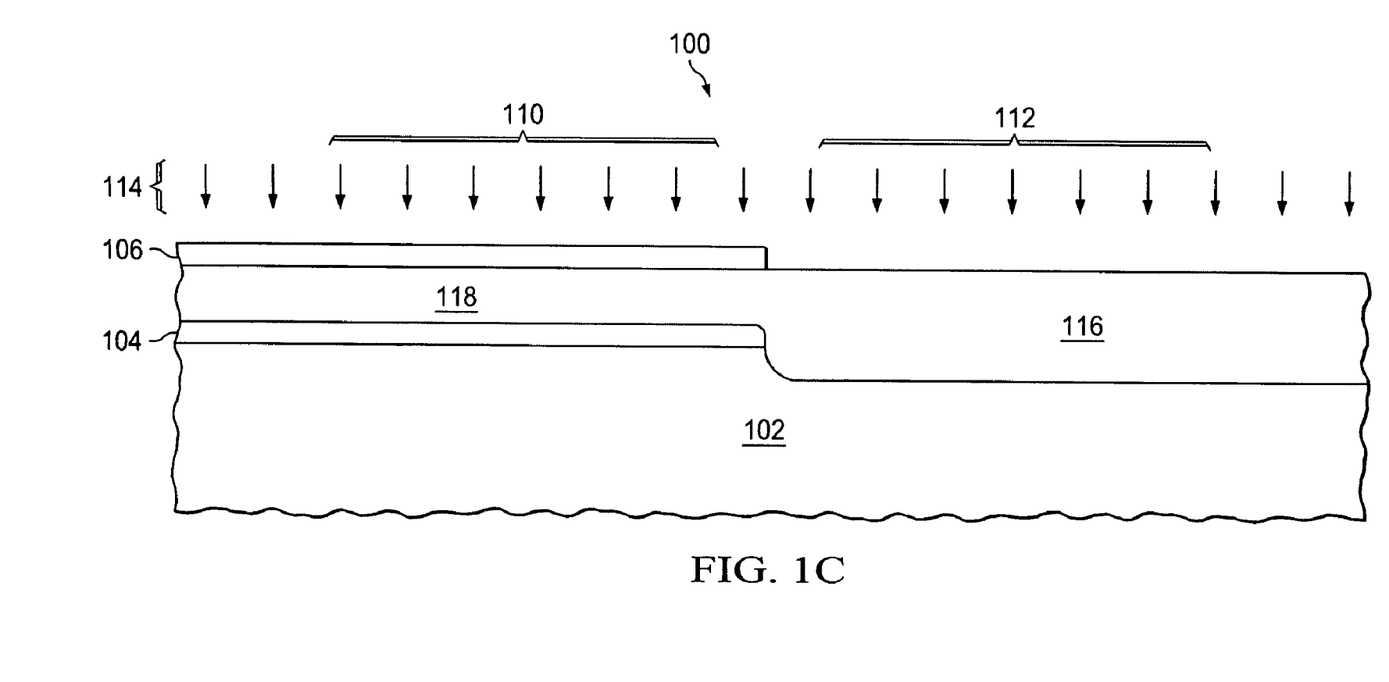

Referring to FIG. 1C, fabrication of the IC (100) continues with an amorphization ion implant process. Ions (114), preferably silicon or germanium, are ion implanted into the IC (100) at a dose and an energy sufficient to form an amorphous silicon region (116) in the NMOS region (112) from the top surface of the DSB layer to a depth greater than the thickness of the DSB layer. For example, a silicon ion implant with a dose of $2.5 \cdot 10^{15}$ cm$^{-2}$ at an energy of 70 keV is sufficient to amorphize 165 nanometers of crystalline silicon, and thus would be appropriate for a 150 nanometer thick DSB layer. The amorphization hard mask (106) blocks enough of the implanted ions (114) that the crystalline silicon in the DSB layer (104) in the PMOS region (110) is amorphized from the top surface of the DSB layer to a depth approximately two-thirds of the DSB layer thickness, forming a shallower amorphous silicon region (118) in the PMOS region (110). The thickness of the amorphization hard mask (106) is set by a desired depth of the amorphous region (118) in the PMOS region (110) and by the amorphization ion implant dose and energy.

Figure 1D:
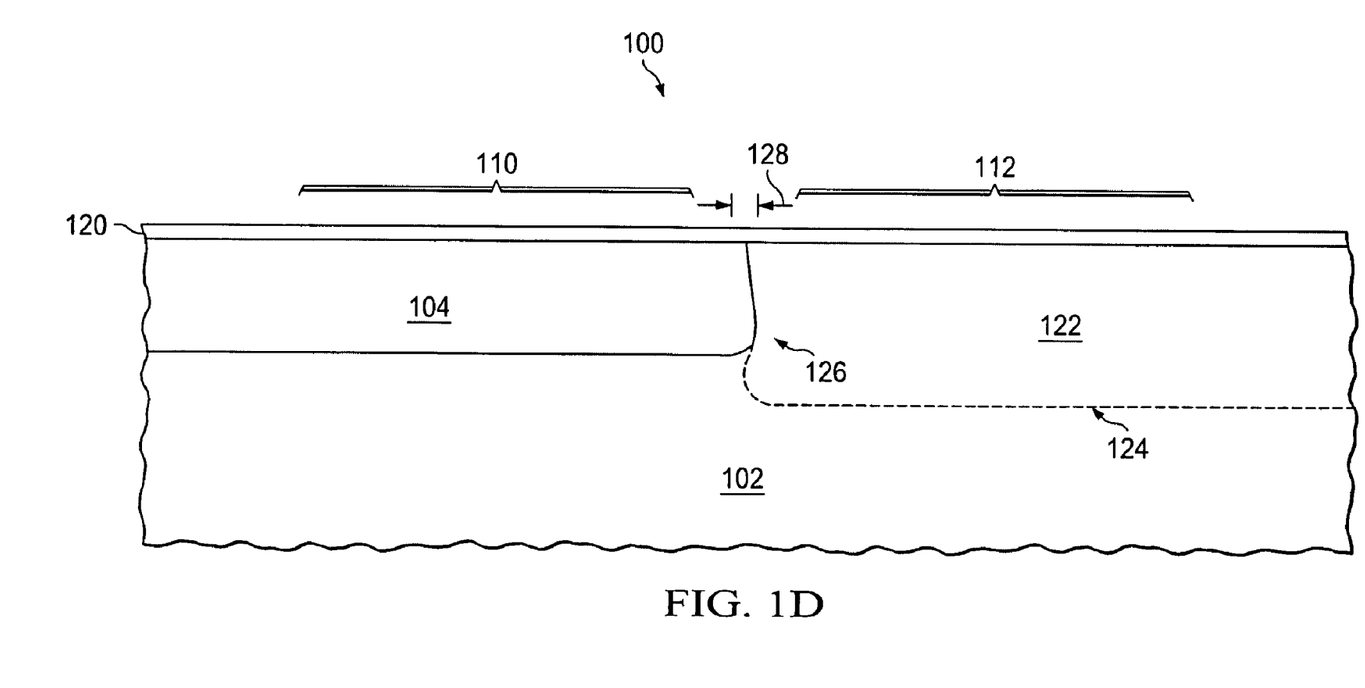

FIG. 1D depicts the IC (100) after removal of the amorphization hard mask layer, deposition of a recrystallization oxide cap layer (120), and a subsequent recrystallization process known as solid phase epitaxy (SPE) in which the amorphous silicon in the NMOS region (112) is recrystallized into a (100)-oriented SPE layer (122), and the amorphous silicon in the PMOS region (110) is recrystallized into a (100)-oriented lattice. The recrystallization oxide cap layer (120) is typically 10 to 30 nanometers of silicon dioxide deposited by plasma enhanced chemical vapor deposition (PECVD). The recrystallization oxide cap layer (120) must be formed at a low temperature so that recrystallization does not commence to any substantial degree and must also bond well enough to the silicon at the top surfaces of the amorphous layers in the NMOS region and the PMOS region so that the recrystallized silicon in supports MOS transistors with performance equivalent to bulk crystalline silicon. Any dielectric layer or layers which meet these two requirements is within the scope of the instant invention. In the NMOS region (112), the (100)-oriented substrate (102) provides the seed layer for recrystallization, and recrystallization is accomplished so that there are substantially no discontinuities or defects at the original boundary (124) between the amorphous region and the substrate. In the PMOS region (110), the (110)-oriented silicon in a bottom region of the DSB layer (104) provides the seed layer for recrystallization. Thus, it is important for the amorphization hard mask to block enough of the amorphization ion implant to leave sufficient (110)-oriented crystalline silicon in the DSB layer to provide a seed layer for recrystallization of the amorphous layer into a (110)-oriented lattice. A typical recrystallization process includes a first anneal at 600 C for 2 hours in a nitrogen ambient followed by a second anneal at 1050 C for 2 hours in a nitrogen ambient. The lateral boundary (126) between the (110)-oriented DSB layer and the (100)-oriented SPE layer is substantially vertical, due to a reduction in lateral growth of (110)-oriented silicon because of the amorphous condition of the silicon in the upper region of the DSB layer during the SPE process. A width (128) of the boundary region (126) including discontinuities and defects is less than 40 nanometers, which is advantageous because NMOS and PMOS transistors can be positioned closer together, resulting in more efficient IC layouts and lower manufacturing costs per IC, as well as enabling transistor scaling for subsequent integrated circuit fabrication nodes.

Figure 1E:
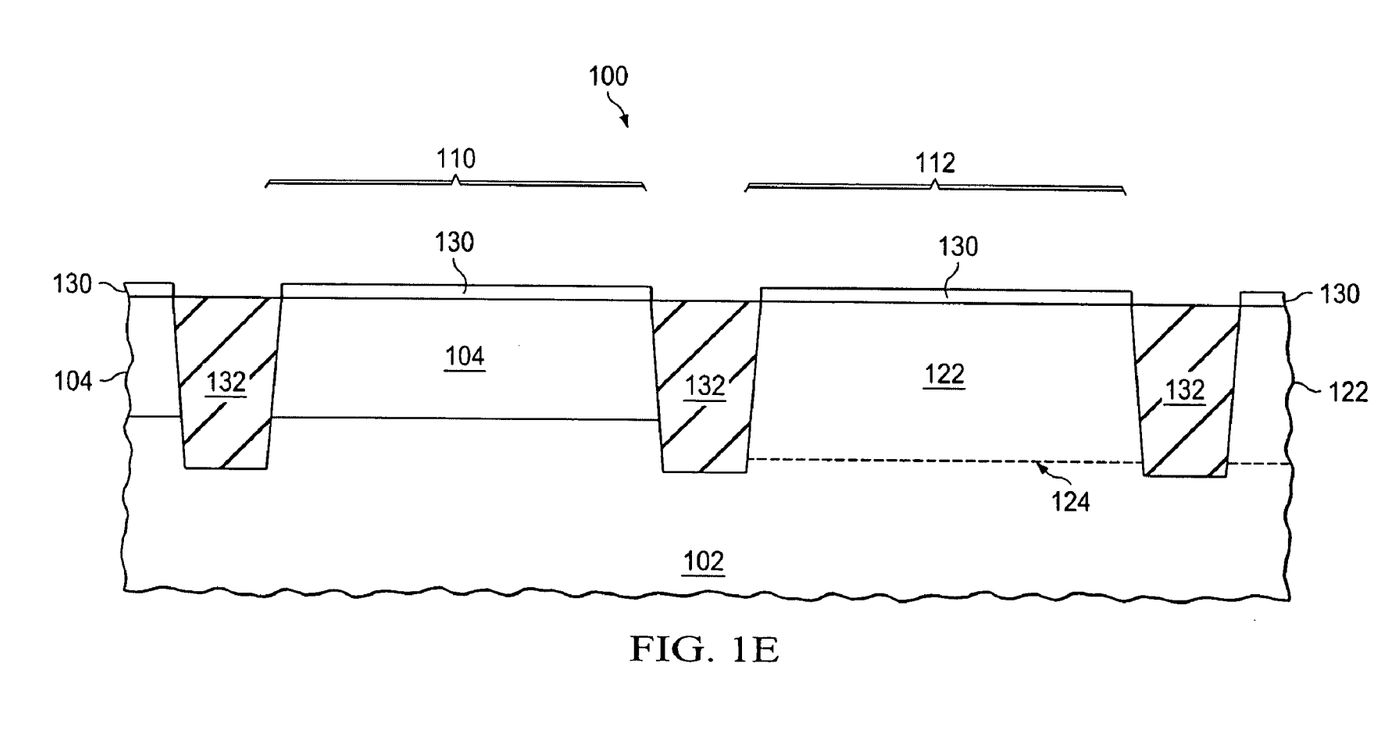

Referring to FIG. 1E, fabrication of the IC (100) continues with growth of an SPE sacrificial oxide layer, not shown in FIG. 1E, typically 5 to 15 nanometers of thermal oxide, to consume defects at the top surfaces of the substrate in the PMOS region and the NMOS region. Regions of field oxide (132) are formed by a shallow trench isolation (STI) process sequence, in which trenches, commonly 200 to 500 nanometers deep, are etched into the IC, electrically passivated, commonly by growing a thermal oxide layer on sidewalls of the trenches, and filled with insulating material, typically silicon dioxide, commonly by a high density plasma (HDP) process or a high aspect ratio process (HARP). In a preferred embodiment, the SPE sacrificial oxide layer is reused as a sacrificial pad oxide for the STI process. This is advantageous because reuse of the sacrificial oxide layer reduces an offset between the top surface of the NMOS region and the top surface of the PMOS region, which results from a difference in oxidation rates between (110) oriented silicon and (110) oriented silicon. The lateral boundary region between the DSB layer (104) and the SPE layer (122) is occupied by a field oxide (132) region, providing an electrically passivated lateral boundary for the (100)-oriented layer (122) and the (110)-oriented layer (104). After formation of the field oxide (132), a sacrificial oxide layer (130) is grown on the top surfaces of the NMOS region and the PMOS region to protect the surfaces during a subsequent well formation process sequence.

Figure 1F:
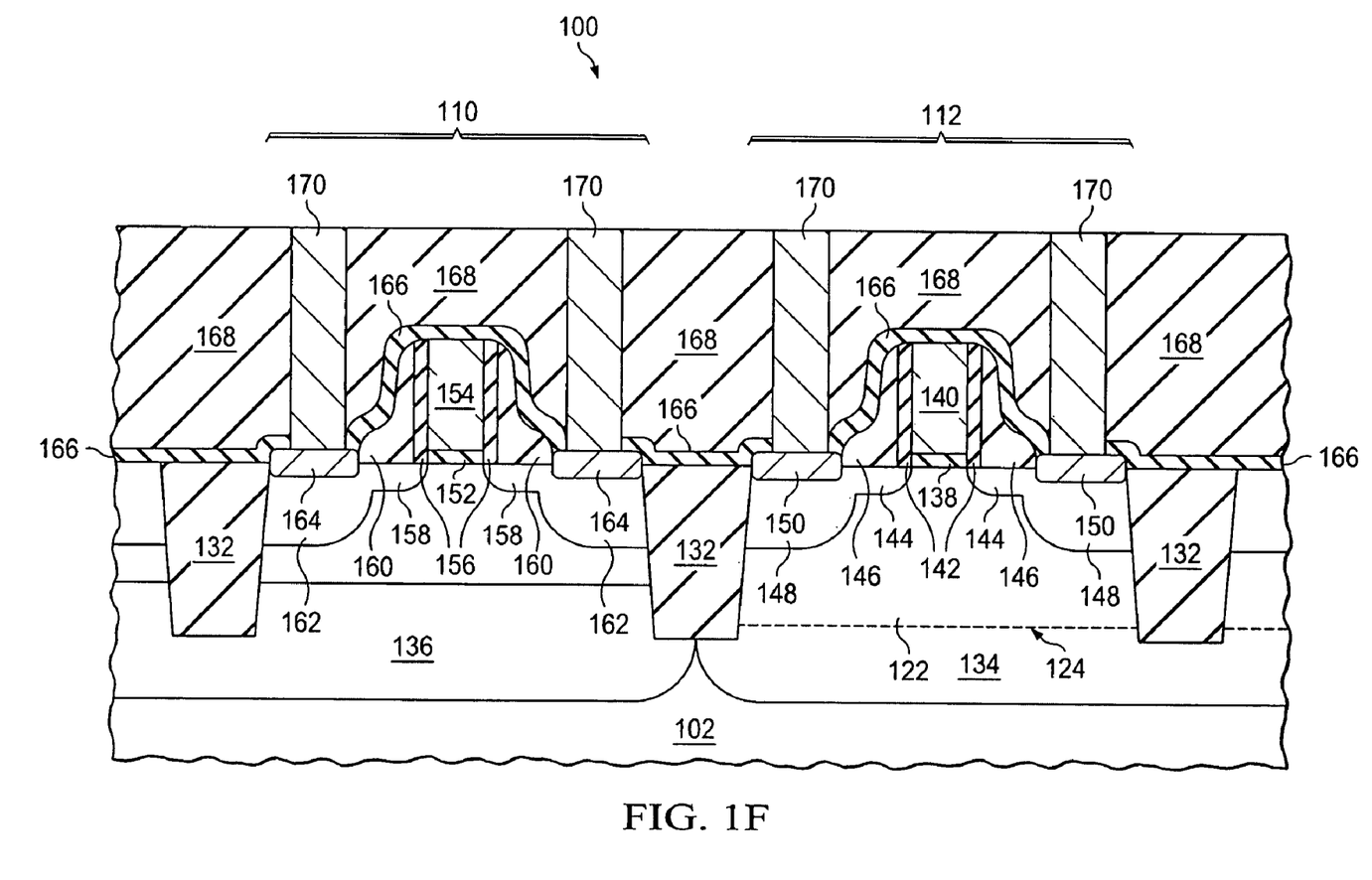

Fabrication of the IC on the HOT substrate prepared according to the instant invention is depicted in FIG. 1F. A p-type well (134) is formed in the regions defined for NMOS transistors by known methods of ion implanting p-type dopants such as boron, BF2 or indium, commonly in several step with doses from $1 \cdot 10^{10}$ to $1 \cdot 10^{14}$ cm$^{-2}$ at energies from 2 keV to 200 keV. Similarly, an n-type well (136) is formed in regions defined for PMOS transistors by known methods of ion implanting n-type dopants such as phosphorus, arsenic or antimony, commonly in several step with doses from $1·10^{10}$ to $1·10^{14}$ cm$^{-2}$ at energies from 1 keV to 500 keV. Formation of an NMOS transistor proceeds with formation of an NMOS gate dielectric layer (138), typically silicon dioxide, nitrogen doped silicon dioxide, silicon oxy-nitride, hafnium oxide, layers of silicon dioxide and silicon nitride, or other insulating material, on a top surface of the p-type well (134), followed by formation of an NMOS gate (140), typically polycrystalline silicon, on a top surface of the NMOS gate dielectric layer (138), with NLDD offset spacers (142), typically one or more layers of silicon dioxide and/or silicon nitride formed by plasma etch, with a width from 1 to 30 nanometers, on lateral surfaces of the NMOS gate (140). N-type medium doped drain regions (NLDD) (144) are formed in the p-type well (134) adjacent to the NMOS gate (140) by ion implantation of n-type dopants such as phosphorus, arsenic and/or antimony, commonly in several step with doses from $1·10^{13}$ to $1·10^{16}$ cm$^{-2}$ at energies from 1 keV to 10 keV. Typical depths of n-type dopants in the NLDD (144) range from 5 to 50 nanometers. Following ion implantation of n-type dopants into the NLDD (144), NMOS gate sidewall spacers (146) are formed on lateral surfaces of the NLDD offset spacers (142), commonly by deposition of layers of silicon dioxide and silicon nitride spacer material followed by anisotropic etchback to remove spacer material from horizontal surfaces of the IC (100). Typical NMOS gate sidewall spacer widths range from 3 to 100 nanometers. Following formation of the NMOS gate sidewall spacers (146), NMOS source and drain regions (NSD) (148) are formed by in the p-type well (134) adjacent to the NMOS gate sidewall spacers (146) by ion implantation of n-type dopants such as phosphorus, arsenic and/or antimony, commonly in several step with doses from $1·10^{14}$ to $1·10^{16}$ cm$^{-2}$ at energies from 3 keV to 50 keV. Typical depths of n-type dopants in the NSD (148) range from 10 to 250 nanometers. In a preferred embodiment, the thickness of the DSB layer (104) and the depth of the amorphous region formed by the amorphization ion implant are set so that the interface (124) between the substrate (102) and the SPE layer (122) is below a space charge region of the NSD (148). Anneals may be performed after the NLDD ion implants and the NSD ion implants to repair damage to the silicon lattice of the SPE layer (122) by the ion implantation processes. The p-type well (134), NMOS gate dielectric layer (138), NMOS gate (140), NLDD offset spacers (142), NLDD (144), NMOS gate sidewall spacers (146) and NSD (148) form an NMOS transistor (110). Layers of metal silicide (150) may be formed on top surfaces of the NSD (148) to decrease electrical resistance of contacts made to the NSD (148).

Still referring to FIG. 1F, fabrication of the integrated circuit (100) continues with formation of a PMOS transistor. A PMOS gate dielectric layer (152), typically silicon dioxide, nitrogen doped silicon dioxide, silicon oxy-nitride, hafnium oxide, layers of silicon dioxide and silicon nitride, or other insulating material, on a top surface of the n-type well (136), followed by formation of an PMOS gate (154), typically polycrystalline silicon, on a top surface of the PMOS gate dielectric layer (152), with PLDD offset spacers (156), typically one or more layers of silicon dioxide and/or silicon nitride formed by plasma etch, with a width from 1 to 30 nanometers, on lateral surfaces of the PMOS gate (154). P-type medium doped drain regions (PLDD) (158) are formed in the n-type well (136) adjacent to the PMOS gate (154) by ion implantation of p-type dopants such as boron, BF2 and/or gallium, commonly in several step with doses from $1·10^{13}$ to $1·10^{16}$ cm$^{-2}$ at energies from 0.3 keV to 10 keV. Typical depths of p-type dopants in the PLDD (158) range from 5 to 50 nanometers. Following ion implantation of p-type dopants into the PLDD (158), PMOS gate sidewall spacers (160) are formed on lateral surfaces of the PLDD offset spacers (156), commonly by deposition of layers of silicon dioxide and silicon nitride spacer material followed by anisotropic etchback to remove spacer material from horizontal surfaces of the IC (100). Typical PMOS gate sidewall spacer widths range from 3 to 100 nanometers. Following formation of the PMOS gate sidewall spacers (160), PMOS source and drain regions (PSD) (162) are formed by in the n-type well (136) adjacent to the PMOS gate sidewall spacers (160) by ion implantation of p-type dopants such as boron, BF2 and/or gallium, commonly in several step with doses from $1·10^{14}$ to $1·10^{16}$ cm$^{-2}$ at energies from 3 keV to 50 keV. Typical depths of p-type dopants in the PSD (162) range from 10 to 250 nanometers. In a preferred embodiment, the thickness of the DSB layer (104) is adjusted so that an interface between the substrate (102) and the DSB layer (104) is below a space charge region of the PSD (162). Anneals may be performed after the PLDD ion implants and the PSD ion implants to repair damage to the silicon lattice of the DSB layer (104) by the ion implantation processes. The n-type well (136), PMOS gate dielectric layer (152), PMOS gate (154), PLDD offset spacers (156), PLDD (158), PMOS gate sidewall spacers (160) and PSD (162) form a PMOS transistor (110). Layers of metal silicide (164) may be formed on top surfaces of the PSD (158) to decrease electrical resistance of contacts made to the PSD (158).

Still referring to FIG. 1F, fabrication of the IC (100) continues with formation of a pre-metal dielectric liner (PMD liner) (166), typically silicon nitride, 2 to 100 nanometer thick, on top surfaces of the NMOS transistor (112), the PMOS transistor (110) and the field oxide (132). In some embodiments, a dual stress layer (DSL) PMD liner is formed, which applies different levels of stress to different components in the IC, such as compressive stress on PMOS transistors and tensile stress on NMOS transistors. A pre-metal dielectric layer (PMD) (168), typically silicon dioxide, 152 to 1000 nanometers thick, is formed on a top surface of the PMD liner (166). Contacts (170) to the NSD (162) and PSD (148) are formed by etching holes in the PMD (168) and PMD liner (166) to expose portions of the top surfaces of the NSD (162) and PSD (148), and filling the holes with metals, typically tungsten. The contacts (170) allow electrical connections to be made to the NMOS and PMOS transistors (112, 110).

The formation of the NMOS transistor (112) in the SPE layer (122) is advantageous because the (100)-oriented silicon in the SPE layer maximizes the electron mobility in an NMOS channel, and thus maximizes the NMOS on-state drive current. The formation of the PMOS transistor (110) in the DSB layer is advantageous because the (110)-oriented silicon in the DSB layer maximizes the hole mobility in a PMOS channel, and thus maximizes the PMOS on-state drive current.

It is within the scope of this invention to exchange the silicon crystal lattice orientations of the substrate, DSB layer and SPE layer, and form a p-type well and an NMOS transistor in the DSB layer and an n-type well and a PMOS transistor in the SPE layer, and realize the same advantages with respect to maximization of on-state drive currents explained above.

The silicon crystal lattice orientations of the substrate and DSB layer may be altered from the (100) and (110) orientations described in the embodiments above, to suit a particular application, for example a radiation resistant IC, and still fall within the scope of this invention. This invention generally discloses a method to obtain regions with two silicon crystal lattice orientations for electronic components, and is not limited to the (100) and (110) orientations, nor to transistors as the only components formed in the DSB and SPE layers.

Those skilled in the art to which the invention relates will appreciate that the described implementations are merely illustrative example embodiments, and that there are many other embodiments and variations of embodiments that can be implemented within the scope of the claimed invention.

What is claimed is:

1. A method for forming an integrated circuit substrate containing regions with two different crystal orientations, comprising the steps of:
   providing a single crystal substrate, comprised of silicon with a first crystal lattice orientation;
   forming a layer of directly bonded silicon (DSB) with a second crystal lattice orientation on a top surface of said single crystal substrate;
   forming an amorphization hard mask layer on a top surface of said DSB layer;
   patterning said amorphization hard mask layer whereby regions defined for said first crystal lattice orientation are exposed and regions defined for said second crystal lattice orientation are covered with photoresist;
   etching said amorphization hard mask layer in said regions defined for said first crystal lattice orientation, whereby said DSB layer is exposed in said regions defined for said first crystal lattice orientation;
   performing an amorphization ion implant process whereby said DSB layer in said regions defined for said first crystal lattice orientation is amorphized and a portion of said DSB layer in said regions defined for said second crystal lattice orientation is amorphized to a depth less than a thickness of said DSB layer;
   forming a recrystallization dielectric cap layer on a top surface of said regions defined for said first crystal lattice orientation and on a top surface of said regions defined for said second crystal lattice orientation;
   performing a solid phase epitaxy (SPE) process in which said amorphized DSB layer in said regions defined for said first crystal lattice orientation is recrystallized on said first crystal lattice orientation, and said amorphized portion of said DSB layer in said regions defined for said second crystal lattice orientation is recrystallized on said second crystal lattice orientation;
   forming a sacrificial layer of silicon dioxide on a top surface of said regions defined for said first crystal lattice orientation and on a top surface of said regions defined for said second crystal lattice orientation; and
   forming a region of field oxide at a lateral boundary between said regions defined for said first crystal lattice orientation and said regions defined for said second crystal lattice orientation.

2. The method of claim 1, in which crystal lattice discontinuities at a lateral boundary between regions defined for said first crystal lattice orientation and regions defined for said second crystal lattice orientation are contained in a zone less then 40 nanometers wide.

3. The method of claim 1, in which crystal lattice discontinuities at a lateral boundary between regions defined for said first crystal lattice orientation and regions defined for said second crystal lattice orientation are contained in a zone less then 30 nanometers wide.

4. The method of claim 3, in which:
   said first crystal lattice orientation is a (100) orientation; and
   said second crystal lattice orientation is a (110) orientation.

5. The method of claim 4, in which a thickness of said DSB layer is between 100 and 250 nanometers.

6. The method of claim 5, in which said amorphization ion implant process comprises implanting silicon ions at a dose greater than $1 \cdot 10^{15}$ cm$^{-2}$.

7. The method of claim 6, in which said amorphized portion of said DSB layer in said regions defined for said second crystal lattice orientation has a thickness between one-half and two-thirds a thickness of said DSB layer.

8. The method of claim 7, in which said step of performing a SPE process further comprises the steps of:
   annealing said integrated circuit substrate at 600 C for 2 hours in a nitrogen ambient; and
   annealing said integrated circuit substrate at 1050 C for 2 hours in a nitrogen ambient.

9. A method for forming an integrated circuit comprising the steps of:
   providing a single crystal substrate, comprised of silicon with a first crystal lattice orientation;
   forming a layer of directly bonded silicon (DSB) with a second crystal lattice orientation on a top surface of said single crystal substrate;
   forming an amorphization hard mask layer on a top surface of said DSB layer;
   patterning said amorphization hard mask layer whereby regions defined for said first crystal lattice orientation are exposed and regions defined for said second crystal lattice orientation are covered with photoresist;
   etching said amorphization hard mask layer in said regions defined for said first crystal lattice orientation, whereby said DSB layer is exposed in said regions defined for said first crystal lattice orientation;
   performing an amorphization ion implant process whereby said DSB layer in said regions defined for said first crystal lattice orientation is amorphized and a portion of said DSB layer in said regions defined for said second crystal lattice orientation is amorphized to a depth less than a thickness of said DSB layer;
   forming a recrystallization dielectric cap layer on a top surface of said regions defined for said first crystal lattice orientation and on a top surface of said regions defined for said second crystal lattice orientation;
   performing a solid phase epitaxy (SPE) process in which said amorphized DSB layer in said regions defined for said first crystal lattice orientation is recrystallized on said first crystal lattice orientation, and said amorphized portion of said DSB layer in said regions defined for said second crystal lattice orientation is recrystallized on said second crystal lattice orientation;
   forming a sacrificial layer of silicon dioxide on a top surface of said regions defined for said first crystal lattice orientation and on a top surface of said regions defined for said second crystal lattice orientation;
   forming a region of field oxide at a lateral boundary between said regions defined for said first crystal lattice orientation and said regions defined for said second crystal lattice orientation;
   forming a first well of a first electrical type in said regions defined for said first crystal lattice orientation by ion implanting a first set of dopants of said first electrical type;
   forming a second well of a second electrical type in said regions defined for said second crystal lattice orientation by ion implanting a second set of dopants of said second electrical type;
   forming a first MOS transistor in said first well by a process further comprising the steps of:

forming a first gate dielectric layer on a top surface of said first well;

forming a first gate on a top surface of said first type of gate dielectric layer;

forming a first set of lightly doped drain (LDD) offset spacers on lateral surfaces of said first type of gate;

forming a first set of LDD regions of said second electrical type in said first type of well adjacent to said first type of gate by ion implanting a second set of said second type of dopants;

forming a first set of gate sidewall spacers on lateral surfaces of said first type of LDD offset spacers; and forming a first set of source and drain (SD) regions of said second electrical type in said first type of well adjacent to said first type of gate sidewall spacers by ion implanting a third set of said second type of dopants;

forming a second MOS transistor in said second well by a process further comprising the steps of:

forming a second gate dielectric layer on a top surface of said second well;

forming a second gate on a top surface of said second type of gate dielectric layer;

forming a second set of LDD offset spacers on lateral surfaces of said second type of gate;

forming a second set of LDD regions of said first electrical type in said second type of well adjacent to said second type of gate by ion implanting a second set of said first type of dopants;

forming a second set of gate sidewall spacers on lateral surfaces of said second type of LDD offset spacers; and forming a second set of SD regions of said first electrical type in said second type of well adjacent to said second type of gate sidewall spacers by ion implanting a third set of said first type of dopants;

forming a pre-metal dielectric (PMD) liner on top surfaces of said first type of transistor, said second type of transistor and said field oxide region;

forming a PMD layer on a top surface of said PMD liner; and forming contacts in said PMD layer and said PMD liner to make electrical connections to said first type of SD regions and said second type of SD regions.

10. The method of claim 9, in which crystal lattice discontinuities at a lateral boundary between regions defined for said first crystal lattice orientation and regions defined for said second crystal lattice orientation are contained in a zone less then 40 nanometers wide.

11. The method of claim 9, in which crystal lattice discontinuities at a lateral boundary between regions defined for said first crystal lattice orientation and regions defined for said second crystal lattice orientation are contained in a zone less then 30 nanometers wide.

12. The method of claim 11, in which:
said first crystal lattice orientation is a (100) orientation;
said second crystal lattice orientation is a (110) orientation;
said first electrical type is p-type;
said second electrical type is n-type;
said first MOS transistor is an n-channel MOS transistor; and
said second MOS transistor is a p-channel MOS transistor.

13. The method of claim 12, in which a thickness of said DSB layer is between 100 and 250 nanometers.

14. The method of claim 13, in which said amorphization ion implant process comprises implanting silicon ions at a dose greater than $1 \cdot 10^{15}$ cm$^{-2}$.

15. The method of claim 14, in which said amorphized portion of said DSB layer in said regions defined for said second crystal lattice orientation has a thickness between one-half and two-thirds a thickness of said DSB layer.

* * * * *